United States Patent [19]

Ellerstein et al.

[11] Patent Number: 4,789,625

[45] Date of Patent: Dec. 6, 1988

[54] RADIATION CURABLE COATING FOR PHOTOGRAPHIC LAMINATE, AND DEVELOPMENT PROCESS

[75] Inventors: Stuart M. Ellerstein, Princeton, N.J.; San A. Lee, Yardley, Pa.

[73] Assignee: Morton Thiokol, Inc., Chicago, Ill.

[21] Appl. No.: 877,420

[22] Filed: May 5, 1986

Related U.S. Application Data

[63] Continuation of Ser. No. 419,676, Sep. 20, 1982, abandoned.

[51] Int. Cl.$^4$ .......................... C08F 2/50; C08F 20/36; C08F 20/18; G03C 7/14
[52] U.S. Cl. .................................... 430/372; 430/432; 430/463; 430/536; 430/961; 430/532; 522/96; 522/42; 522/21; 522/182
[58] Field of Search ............... 430/432, 372, 961, 536, 430/532, 463

[56] References Cited

U.S. PATENT DOCUMENTS

| | | | |
|---|---|---|---|
| Re. 29,131 | 2/1977 | Smith et al. | 204/159.14 |
| Re. 29,139 | 2/1977 | Smith et al. | 260/77.5 AN |
| 3,924,023 | 12/1975 | Boranian et al. | 428/334 |
| 4,020,125 | 4/1977 | Suzuki et al. | 260/859 R |
| 4,120,721 | 10/1978 | Ketley et al. | 96/36.3 |
| 4,129,667 | 7/1978 | Lorenz et al. | 427/44 |
| 4,135,007 | 1/1979 | Lorenz et al. | 427/44 |
| 4,137,081 | 1/1979 | Pohl | 204/159.15 |
| 4,174,218 | 11/1979 | Pohl | 430/286 |
| 4,293,398 | 10/1981 | Prucnal | 204/181 C |
| 4,299,743 | 10/1981 | Pierce et al. | 524/590 |
| 4,333,998 | 6/1982 | Leszyk | 430/12 |
| 4,353,980 | 10/1982 | Helling | 430/532 |
| 4,400,560 | 8/1983 | Richter et al. | 521/158 |
| 4,477,548 | 10/1984 | Harasta | 430/532 |
| 4,499,163 | 2/1985 | Ishimaru et al. | 430/284 |

FOREIGN PATENT DOCUMENTS

| | | |
|---|---|---|
| 516747 | 1/1979 | Australia. |
| 518456 | 1/1979 | Australia. |
| 2070634 | 9/1981 | United Kingdom. |
| 2085023 | 4/1982 | United Kingdom. |

Primary Examiner—John C. Bleutge
Assistant Examiner—Arthur H. Koeckert
Attorney, Agent, or Firm—George Wheeler; Gerald K. White

[57] ABSTRACT

Compositions comprising an impermeable acrylate-terminated oligomer, a reactive diluent, and 2-hydroxycyclohexylphenone, 2-hydroxy-2-methyl-1-phenyl-propan-1-one, or diethoxyacetophenone as a photoinitiator, are disclosed. These compositions have utility in optical coatings and electrical insulation.

24 Claims, No Drawings

RADIATION CURABLE COATING FOR PHOTOGRAPHIC LAMINATE, AND DEVELOPMENT PROCESS

This is a continuation of co-pending application Ser. No. 419,676 filed on Sept. 20, 1982, now abandoned.

BACKGROUND OF THE INVENTION

A. Field of the Invention

This invention relates to ultraviolet radiation curable compositions suitable for use as optical coatings and in electrical insulation.

Manufacturers of photographic films have been attempting to perfect three-dimensional-effect color films for some time. One approach currently under investigation is to deposit a clear, lenticulated optical coating onto conventional photographic print material. The optical coating is responsible for the three dimensional effect and is usually composed of a cross-linked, ultraviolet-radiation-cured acrylic polymer supported by a transparent polyester base. The optical coating is typically 8–11 mils (0.008–0.011 inch) thick. Lenticulated optical coatings are described in J. Nims et al, "Three Dimensional Pictures And Method Of Composing Them," U.S. Pat. No. 3,852,787 (Dec. 3, 1974).

An optical coating should possess several characteristics; foremost among them is optical clarity. The optical coating must not be susceptible to yellowing or other discoloration prior to, during, and after exposure and developing of the color print material underlying the optical coating.

In addition to optical clarity, the optical coating must be sufficiently flexible so as not to crack when the film is bent in half. An elongation of from 15 to 65 percent is preferred.

The physical characteristics of the optical coating are highly dependent upon the choice of acrylate-terminated oligomers employed in the manufacture of the optical coating. In addition to providing a cured acrylic optical coating which satisfies the requirements discussed above, the uncured optical coating composition should possess a rapid cure rate, thereby allowing processing speeds of at least 15 feet per minute and preferably 30–60 feet per minute.

Typically, acrylate-terminated oligomers which possess polyester or polyether backbones have been employed in the manufacture of optical coatings. Polyester-based acrylic coatings display poor hydrolytic stability. Conventional water-based photographic developers can easily penetrate polyester-based, and to a lesser extent, polyether-based, acrylic optical coatings, thereby causing severe yellowing of the optical coating. Polyether-based acrylic coatings suffer from poor oxidative stability.

The ultraviolet radiation curable compositions of the present invention also have utility in the field of electrical insulation. Electrical insulation should possess several properties, such as a low dielectric constant, low dissipation factor, low moisture vapor transmission, and a high surface resistivity. The compositions of the present invention possess these properties.

B. Description of the Prior Art

H. Hisamatsu et al, "Photopolymerizable Isocyanate-Containing Prepolymers," U.S. Pat. No. 3,891,523 (June 24, 1975) discloses UV curable, acrylate-terminated polyurethane prepolymers which have a free isocyanate content of from 0.3 to 15 percent based on the total weight of the prepolymer and a cure initiator. The excess isocyanate groups are stated to impart superior adhesion to a substrate.

N. Miyata et al, "Photopolymerizable Vinylurethane Monomer," U.S. Pat. No. 3,907,865 (Sept. 23, 1975) discloses acrylate-terminated polyurethane oligomers which are highly UV curable and which, upon curing, form a non-yellowing acrylic film. The reference requires the use of xylylene diisocyanate in the preparation of its acrylate-terminated polyurethane oligomer.

D. Lorenz et al, "Radiation Curable Coating Composition Comprising An Acryl Urethane Oligomer And An Ultra-Violet Absorber," U.S. Pat. No. 4,129,667 (Dec. 12, 1978) discloses an acrylate-terminated, polyether or polyester-based polyurethane oligomer which is employed in combination with an acrylic ultraviolet radiation absorber.

D. Lorenz et al, "Radiation Curable Coating Composition Comprising An Acryl Urethane Oligomer And An Ultra-Violet Absorber," U.S. Pat. No. 4,135,007 (Jan. 17, 1979) discloses a radiation curable coating composition comprising an acrylate-terminated, polyether or polyester-based polyurethane oligomer and a benzylidene acid ester.

D. Carlick et al, "Isocyanate-Modified Esters," U.S. Pat. No. 3,783,151 (Jan. 1, 1974) discloses that the hydrophillic nature of polyester-based acrylic films may be somewhat lessened by introducing urethane linkages on the polyester monomer via an isocyanate. The urethane-branched, polyester-based acrylic films so prepared do not undergo color change under normal curing conditions.

A. Boranian et al, "Floor Tile Production And Products," U.S. Pat. No. 3,924,023 (Dec. 2, 1975) discloses mar-resistant transparent wear layers which are coated upon vinyl asbestos and asphalt floor tiles. A UV curable composition comprising an acrylate-terminated urethane oligomer of the formula:

$$A-B_1-\left[O-\overset{O}{\overset{\|}{C}}-\overset{H}{\overset{|}{N}}-B_2-\overset{H}{\overset{|}{N}}-\overset{O}{\overset{\|}{C}}-O-B_3\right]_x-O-\overset{O}{\overset{\|}{C}}-\overset{H}{\overset{|}{N}}-B_2-\overset{H}{\overset{|}{N}}-\overset{O}{\overset{\|}{C}}-O-B_1-A$$

wherein A is either

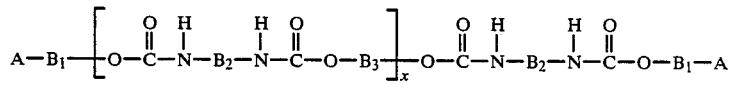

R being H or $CH_3$; x is 0, 1 or 2; and $B_1$, $B_2$ and $B_3$ are each taken from the group consisting of an alkylene of the type

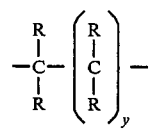

where R is H, $CH_3$ or $C_2H_5$ and y is either 0 or 1 to 6, cycloalkylene of the type

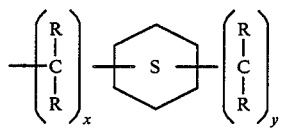

wherein R is H, CH₃ or C₂H₅, x=0 or 1 or 2 and y=0 or 1 or 2, oxyalkylene of the type

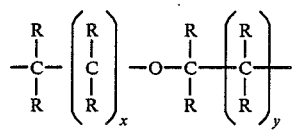

wherein R is H, CH₃, or C₂H₅, and x or y are both either 1, 2 or 3;

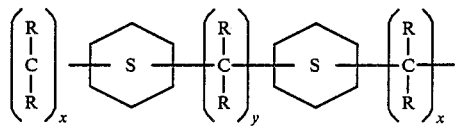

where R is H, CH₃ or C₂H₅, y is 0, 1, 2 or 3, and x is 0, 1 or 2; and

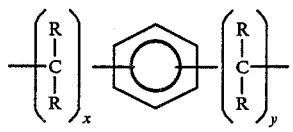

wherein R is H, CH₃ or C₂H₅, and x and y are both either 1 or 2, a reactive diluent, and a photoinitiator, is disclosed.

D. Kramm et al, "Radiation Curable, Ethylenically Unsaturated Thixotropic Agent And Method Of Preparation," U.S. Pat. No. 4,204,010 (May 20, 1980) discloses an acrylate terminated polyurethane oligomer containing an ester linkage which imparts thixotropic properties to liquid, radiation curable vehicles which are used as varnishes, coatings, photoresist adhesives, and sealants.

SUMMARY OF THE INVENTION

The applicants' invention is a composition of matter comprising:
(i) from 45 to 90 weight percent, based upon the total composition weight, of an oligomer of the formula:

wherein $R^1$ and $R^2$ are independently linear, branched, or cyclic saturated alkylene radicals of from six to twenty carbon atoms,
n is a whole number from zero to three,
Q and X are independently either
(a) a radical of the formula:

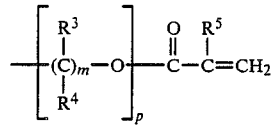

where $R^3$, $R^4$, and $R^5$ are independently selected from the group consisting of hydrogen, methyl, ethyl, or propyl, m is an integer of from 1 to 10, and p is zero or one,
(b) a saturated alkyl radical of from nine to twenty carbon atoms, with the proviso that said oligomer must possess at least one acrylate or methacrylate group;
(ii) from nine to 50 weight percent, based upon the total composition weight, of a reactive diluent selected from the group comprising lauryl acrylate, lauryl methacrylate, stearyl acrylate, stearyl methacrylate, ethylhexylacrylate, isodecyl acrylate, and mixtures thereof; and
(iii) from 0.5 to 5 weight percent, based upon the total composition weight, of a photoinitiator selected from the group consisting of 2-hydroxycyclohexylphenone, 2-hydroxy-2-methyl-1-phenylpropan-1-one, and diethoxyacetophenone.

When cured, the composition described above solidifies into a dry, water-resistant film which is resistant to yellowing and suitable for use in a lenticulated optical coating.

DETAILED DESCRIPTION OF THE INVENTION

The applicants have discovered that a composition comprising an acrylate-terminated polyurethane oligomer conforming to formula I above, a reactive diluent, and a specific photoinitiator satisfies the rigorous criteria required of optical coatings.

A. THE ACRYLATE-TERMINATED POLYURETHANE OLIGOMER

The acrylate-terminated polyurethane oligomer is composed of an organic polymeric backbone which has been end-capped with a diisocyanate which is itself then further reacted with an acrylation agent.

1. The Organic Polymeric Backbone

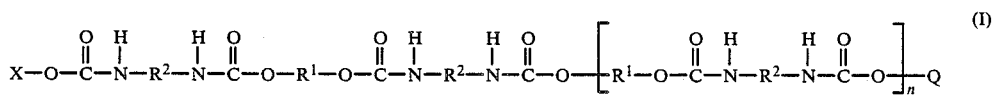

The organic polymeric backbone which is employed in the applicants' invention is formed from an aliphatic polyurethane precursor of the formula:

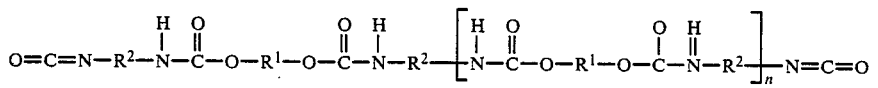 (II)

wherein $R^1$ and $R^2$ are independently linear, branched, or cyclic saturated alkane radicals of from 6 to 20 carbon atoms and n is a whole number from zero to three.

The aliphatic polyurethane precursor has a molecular weight range of from about 450 to about 2,500. It is prepared by a polyurethane polymerization reaction between a suitable diisocyanate and a saturated alkanediol, thereby forming a diisocyanate terminated, aliphatic polyurethane precursor.

Linear, branched or cyclic alkanediols of from six to twenty carbon atoms may be employed in the preparation of the aliphatic polyurethane precursor. Branched alkanediols are preferred. Suitable alkanediols include 2-ethyl-2-butyl-1,3-propanedool, 1,6-hexanediol, 2-ethyl-1,3-hexanediol, 2,5-dimethyl-2,5-hexanediol, trimethylpentanediol, 5,5-dimethanolheptane, and 1,4-cyclohexanedimethanol. 2-ethyl-1,3-hexanediol is preferred because optical coatings prepared with this alkanediol exhibit a good balance of surface hardness and resistance to yellowing.

The choice of diisocyanate has an effect upon the flexibility and optical clarity of the cured optical coating. Non-aromatic diisocyanates of from six to twenty carbon atoms may be employed in the preparation of the polyurethane precursor. Aromatic diisocyanates are unacceptable due to their tendency to cause yellowing of the cured optical coating. Suitable saturated, aliphatic diisocyanates include dicyclohexylmethane-4,4'-diisocyanate, isophorone diisocyanate, hexamethylene diisocyanate, and trimethylhexamethylene diisocyanate. Trimethylhexamethylene diisocyanate is preferred because it offers good flexibility and low toxicity.

The reaction between the alkanediol and the diisocyanate generally requires a small amount of catalyst, typically from 100 to 200 ppm. Suitable catalysts include dibutyltin oxide, dibutyltin dilaurate, stannous oleate, stannous octoate, and lead octoate. Tertiary amines such as triethylamine, diethylmethylamine, dimethylethylamine, morpholine, N-ethyl morpholine, triethylene diamine and piperazine may also be employed. Dibutyltin dilaurate is preferred because of its high reactivity.

The cured optical coating's properties may be optimized by careful modification of the aliphatic polyurethane precursor synthesis. Such modification may include the following:

1. employing a mixture of two or more alkanediols in various mole ratios to improve the flexibilty and toughness of the cured optical coating;

2. incorporating long chain monofunctional alkanols of from nine to twenty carbon atoms into the polyurethane precursor thereby reducing the acrylic functionality of the oligomer below 2.0, and improving the flexibility of the cured optical coating; and 3. employing a slight excess of diisocyanate, thereby increasing the average molecular weight by chain extension of the precursor up to about 2,500. Optical coatings formed from a high molecular weight polyurethane oligomer are more flexible than those formed from lower molecular weight oligomers.

The preferred modification is the incorporation of a long chain monofunctional alkanol into the aliphatic polyurethane precursor. The alkanol is premixed with the acrylation agent prior to reaction with the polyurethane precursor. The monofunctional alkanol will reduce the number of isocyanate groups available on the polyurethane precursor for reaction with the acrylation agent, thereby lowering the acrylic functionality of the oligomer. This, in turn, improves the flexibility and hydrolytic stability of the cured optical coating. Suitable alkanols include n-octanol, n-nonanol, n-decanol, n-undecanol, n-dodecanol, n-tetradecanol, n-hexadecanol, n-octadecanol 2-ethylhexanol and mixtures thereof. A typical acrylation agent/alkanol mixture is 75% hydroxyethyl acrylate and 25% n-decanol.

2. The Acrylation Agent

The acrylation agent is a hydroxyl-terminated aliphatic acrylate or methacrylate which must conform to the formula

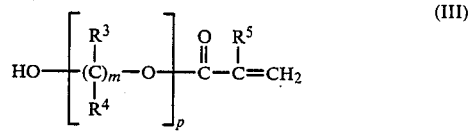 (III)

wherein $R^3$, $R^4$, and $R^5$ are independently selected from the group consisting of hydrogen, methyl, ethyl, or propyl, m is an integer of from 1 to 10, and p is zero or one.

The choice of acrylation agent affects the degree of crosslinking and moisture resistance of the cured optical coating. The choice of acrylation agent also affects the cure rate of the polyurethane oligomer. Suitable hydroxyl-terminated monoacrylates include hydroxyethyl acrylate, hydroxyethyl methacrylate, hydroxypropyl acrylate, and hydroxypropyl methacrylate. Hydroxyethyl acrylate is preferred because it imparts a faster cure rate to the polyurethane oligomer.

The acrylation agent should be added to the polyurethane precursor in the absence of light. To further minimize the possibility of premature gellation, one or more of the following precautions may be taken:

1. Maintaining the reaction temperature at or below 65° C.

2. Adding 30 to 100 ppm of an acrylate stabilizer such as phenothiazine, hydroquinone, or methyl ether of hydroquinone.

3. Adding 15 to 20 weight percent of a reactive diluent to lower the reaction mixture viscosity, thereby permitting more efficient heat transfer. Suitable reactive diluents include lauryl acrylate and 2-ethylhexyl acrylate.

4. Running the reaction under dried air.

B. THE REACTIVE DILUENT

The oligomer formed by the acrylation of the polyurethane precursor is a high viscosity liquid. A low molecular weight acrylic monomer is added as a reactive diluent to lower the viscosity of the oligomer. Important considerations governing the selection of the reactive diluent include toxicity, volatility, effect on the optical clarity and flexibility of the cured optical coating, and cost. Acceptable reactive diluents include lauryl acrylate, lauryl methacrylate, stearyl acrylate, stearyl methacrylate, and ethylhexylacrylate. Lauryl acrylate is preferred because it imparts good flexibility to the cured optical coating. Ethylhexylacrylate is preferred due to its low cost and low odor.

In some cases, diacrylates or triacrylates may be employed as the reactive diluent to impart enhanced surface hardness and adhesion to the cured optical coating composition. The cure speed of the optical coating composition is usually more rapid when diacrylates or triacrylates are employed as the reaction diluent.

C. THE PHOTOINITIATOR

The selection of photoinitiator is critical. It must provide reasonable curing speed without causing premature gellation of the optical coating composition. It must not affect the optical clarity of the cured optical coating. Only three photoinitiators - 2-hydroxycyclohexylphenone, 2-hydroxy-2-methyl-1-phenyl-propan-1-one and diethoxyacetophenone are acceptable for use as the photoinitiator. 2-hydroxycyclohexylphenone is commercially available from Ciba-Geigy Corp., Dyestuffs and Chemicals Division, Greensboro, N.C. 27409, under the tradename CGI-184. 2-hydroxy-2-methyl-1-phenyl-propan-1-one is commercially available from EM Chemicals Company, 500 Executive Blvd., Elmsford, N.Y. 10523, under the tradename DAROCUR 1173. Diethoxyacetophenone is commercially available from the UpJohn Company, Fine Chemicals Division, North Haven, Conn. 06473.

An amount of photoinitiator sufficient to impart reasonable curing speed without causing premature gellation of the optical coating composition is required. By "reasonable curing speed" it is meant sufficient cure reactivity to allow processing speeds of at least 15 feet per minute. Photoinitiator concentration typically ranges from 0.5 to 5 weight percent based upon the total weight of the optical coating composition.

Cure of the optical coating composition is achieved by depositing the coating composition onto a clear plastic support and passing the supported coating composition under an ultraviolet or ionizing (electron beam) radiation source. The coated side of the support is exposed to the radiation for a time sufficient to initiate addition polymerization of the acrylate or methacrylate groups of the coating composition. The polymerization process is preferably performed under an inert atmosphere such as nitrogen. The resulting clear acrylic film bonded to a clear plastic base is termed a "cured optical coating."

By "ultraviolet radiation source" it is meant any radiation source which will emit radiation in wavelengths of from 2000 to 4000 angstroms in sufficient intensity to produce free radicals in the optical coating composition and thereby induce addition polymerization of olefinic bonds, typically from 0.0004 to 6.0 watts/cm$^2$. Suitable radiation sources include Type RS sunlamps, carbon arc lamps, xenon arc lamps, mercury vapor lamps, tungsten halide lamps, fluorescent lamps with ultraviolet light emitting phosphors, and lasers.

By "ionizing radiation source" it is meant any radiation source which will emit radiation having energy of greater than 3 electron volts.

D. HOW TO USE

The cured acrylic film of the optical coating may be lenticulated by conventional processes. The clear plastic support of the lenticulated optical coating is then bonded to a conventional photoemulsion supported by a permeable backing material. The resulting laminate, consisting of the following layers-lenticulated acrylic film which is resistant to yellowing, clear plastic support, photoemulsion, and backing material—is termed an "unexposed color print material."

Unexposed color print material may be developed by conventional photographic development processes, which typically comprise:

1. Projecting the image of a color print negative upon the surface of the color print material, thereby "exposing" the color print material;
2. Immersing the exposed color print material in a "developer" solution for a time sufficient to react the dyes and pigments in the color print photoemulsion, typically 4 minutes;
3. Immersing the exposed color print material in a "fixer" solution which stops further reaction of the color print material photoemulsion;
4. Immersing the exposed color print material in a water rinse for a time sufficient to remove all traces of the "developer" and "fixer" solutions, typically 4 minutes at 91° F; and
5. Drying the developed color print material.

The applicants have discovered that replacing the water rinse with an aqueous alkanol solution in step 4 above eliminates any residual yellowing the optical coating might otherwise display. Alkanols of from 1 to 5 carbon atoms may be employed the aqueous alkanol solution. Due to its toxicity, methanol is not recommended. Isopropanol is the preferred alkanol.

The aqueous alkanol solution may contain from 15 to percent alkanol by weight. Twenty to thirty percent isopropanol is preferred.

While the temperature of the aqueous alkanol solution may range from room temperature to about 120° F., a temperature of 91° F. is preferred.

The immersion time required to ensure that the cured optical coating will not yellow will depend upon various processing conditions such as the alkanol employed, the concentration of the aqueous alkanol solution, and the temperature. An immersion time of 3 minutes is effective when a 25 percent isopropanol aqueous solution maintained at 91° F. is employed.

E. DESCRIPTION OF PREFERRED EMBODIMENTS

The applicants have achieved optimum results from an optical coating composition composed of (i) 84.2 percent, based upon total composition weight, of an oligomer prepared by reacting premixed 2-ethyl-1,3-hexanediol and a diol derivative of ricinoleic acid (9:1 mole ratio) with trimethylhexamethylene diisocyanate, followed by endcapping with 2-hydroxyethyl acrylate, (ii) 14.9 percent, based upon the total composition weight, of 2-ethylhexylacrylate, employed as a reactive diluent, (iii) approximately 1 percent, based upon the total composition weight, of 2-hydroxycyclohexylphenone as the photoinitiator.

A small amount of ricinoleic acid derivative is employed to enhance film integrity and toughness. Small amounts of unsaturated monomer will not materially detract from the cured optical coating's resistance to yellowing.

The applicants have further discovered that even better optical coatings may be obtained by the addition of (1) small amounts of hydroquinone methyl ether and (2) hexanediol diacrylate. The hydroquinone methyl ether is an antioxidant which also acts as a blue dye former in combination with the photographic developer. The very pale blue color aids in combating any trace of yellowing. Any excess blue can be compensated when color balancing the picture. The use of hexanediol diacrylate provides lower viscosity, faster curing, higher adhesion to the plastic support, and lower cost.

The optimum optical coating composition developed to date comprises:

(i) 56.6 percent, based upon total composition weight, of an oligomer prepared by reacting pre-mixed 2-ethyl-1,3-hexanediol and a diol derivative of ricinoleic acid (9:1 mole ratio) with trimethylhexathylene diisocyanate, followed by endcapping with 2-hydroxyethyl acrylate, (ii) 19.7 percent, based upon total composition weight, of hexanediol diacrylate, (iii) 22.3 percent, based upon total composition weight, of 2-ethylhexyl acrylate, (iv) 1 percent, based upon total composition weight, of 2-hydroxycyclohexylphenone, (v) 0.4 percent, based upon total composition weight, of hydroquinone methyl ether.

EXAMPLES

The Examples which follow are intended to illustrate the practice and advantages of the applicants' invention, and are not intended to limit the scope of their invention in any way. All concentration percentages are measured by total weight of the composition unless otherwise stated.

EXAMPLE I

Preparation Of An Optical Coating Composition Employing An Oligomer Prepared From 2-Ethyl-1,3-Hexanediol, Isophorone Diisocyanate And 2-Hydroxyethyl Acrylate 150 grams (1.35 equivalents) of isophorone diisocyanate were added to a reactor vessel equipped with an agitator, a thermometer, an inert gas inlet and a charging port. The reaction vessel was continuously purged with dry air throughout the oligomer preparation. The isophorone diisocyanate was heated to 65° C. and agitated. 0.04 g of dibutyltin dilaurate was added. 49.3 grams (0.675 equivalents) of 2-ethyl-1,3-hexanediol were added dropwise over the course of 1 hour at a constant temperature of 60°-65° C.

When the theoretical isocyanate content (0.675 equivalents) was reached (about 3 hours), the temperature was raised to 75° C. Over the course of one hour, 78.3 grams (0.675 equivalents) of 2-hydroxyethyl acrylate were added to the reaction mixture. The reaction required approximately 3-4 hours to proceed to completion (final isocyanate concentration less than 0.2%) at a temperature maintained about 75°-80° C. The reaction product was a highly viscous liquid.

281.5 grams of lauryl acrylate were added as a reactive diluent.

11.2 grams of 2-hydroxycyclohexylphenone were then added to form the optical coating composition.

EXAMPLE II

Preparation Of An Optical Coating Composition Employing An Oligomer Prepared From 2-Ethyl-1,3-Hexanediol, Trimethylhexamethylene Diisocyanate And Hydroxypropyl Acrylate Using the procedure of Example I, 52.1 grams (0.71 equivalents) of 2-ethyl-1,3-hexanediol were added to 150 grams (1.43 equivalents) of trimethylhexamethylene diisocyanate in the presence of 0.04 grams of dibutyltin dilaurate to form the isocyanate-terminated polyurethane precursor.

93.0 grams of (0.72 equivalents) of hydroxypropyl acrylate were added to the polyurethane precursor to form the acrylate-terminated polyurethane oligomer.

73.6 grams of 2-ethylhexylacrylate and 7.4 grams of 2-hydroxycyclohexylphenone were added to the oligomer, which was then mixed thoroughly to produce a clear, viscous optical coating composition.

EXAMPLE III

Preparation Of An Optical Coating Composition Employing An Oligomer Prepared From 2-Ethyl-1,3-Hexanediol, Trimethylhexamethylene Diisocyanate And 2-Hydroxyethyl Methacrylate Employing the procedure of Example I, 54.5 grams (0.75 equivalents) of 2-ethyl-1,3-hexanediol were added to 167.3 grams (1.59 equivalents) of trimethylhexamethylene diisocyanate in the presence of about 0.04 grams of dibutyltin dilaurate to form the polyurethane precursor.

110.0 grams (0.85 equivalents) of 2-hydroxyethyl methacrylate were added to the polyurethane precursor to form an acrylate-terminated polyurethane oligomer.

36.9 grams of 2-ethylhexylacrylate and 7.4 grams of 2-hydroxycyclohexylphenone were added to the oligomer, which was then mixed thoroughly to produce a clear, viscous optical coating composition.

EXAMPLE IV

Preparation Of An Optical Coating Composition Employing A High Molecular Weight Oligomer Prepared From 2-Ethyl-1,3-Hexanediol, Isophorone Diisocyanate And 2-Hydroxyethyl Acrylate Using the procedure of Example I, 65.8 grams (0.90 equivalents) of 2-ethyl-1,3-hexanediol were added to 150 grams (1.35 equivalents) of isophorone diisocyanate (a 3/2 NCO/OH ratio) in the presence of about 0.03 grams of dibutyltin dilaurate to form the polyurethane precursor.

52.2 grams (0.45 equivalents) of 2-hydroxyethyl acrylate were added to the polyurethane precursor to form an acrylate-terminated polyurethane oligomer of approximately 1200 average molecular weight.

54.9 grams of lauryl acrylate and 3.7 grams of 2-hydroxycyclohexylphenone were added to 128 grams of the oligomer, which was then mixed thoroughly to produce a clear, viscous optical coating composition, which was labeled IVA.

51.1 grams of 2-ethylhexylacrylate and 3.7 grams of 2-hydroxycyclohexylphenone were added to 137 grams of the oligomer, which was then mixed thoroughly to produce a clear, viscous optical coating composition, which was labeled IVB.

EXAMPLE V

Preparation Of An Optical Coating Composition Employing A High Molecular Weight Oligomer Prepared From 2-Ethyl-1,3-Hexanediol, Isophorone Diisocyanate And 2-Hydroxyethyl Acrylate Using the procedure of Example I, 78.9 grams (1.08 equivalents) of 2-ethyl-1,3-hexanediol were added to 150 grams (1.35 equivalents) of isophorone diisocyanate (a 5/4 NCO/OH ratio) in the presence of about 0.03 grams of dibutyltin dilaurate to form an isocyanate-terminated polyurethane precursor.

31.3 grams (0.27 equivalents) of 2-hydroxyethylacrylate were added to the polyurethane precursor to form an acrylate-terminated polyurethane oligomer of approximately 2000 average molecular weight.

118.3 grams of lauryl acrylate and 4.7 grams of 2-hydroxycyclohexylphenone were added to 118.3 grams of the oligomer, which was then mixed thoroughly to produce a clear, viscous optical coating composition, which was labeled VA.

94.6 grams of 2-ethylhexylacrylate and 4.7 grams of 2-hydroxycyclohexylphenone were added to the remaining 141.9 grams of oligomer to produce a clear viscous optical coating composition, which was labeled VB.

EXAMPLE VI

Preparation Of An Optical Coating Composition Employing An Oligomer Incorporating A Monofunctional Alkanol And Thereby Possessing A Reduced Acrylic Functionality 61.8 grams of 2-hydroxyethyl acrylate are premixed with 28.1 grams of decyl alcohol, and labeled "Acrylation Agent I."

Using the procedure of Example I, 49.3 grams (0.68 equivalents) of 2-ethyl-1,3-hexanediol were added to 150 grams (1.35 equivalents) of isophorone diisocyanate in the presence of about 0.03 grams of dibutyltin dilaurate to form the polyurethane precursor.

89.9 grams of "Acrylation Agent I" were added to the polyurethane precursor to form the acrylate-terminated polyurethane oligomer.

194.8 grams of lauryl acrylate and 9.7 grams of 2-hydroxycyclohexylphenone were added to the oligomer, which was then mixed to produce a clear, viscous optical coating composition.

EXAMPLE VII

Preparation Of An Optical Coating Composition Employing An Oligomer Incorporating A Mixture Of Monofunctional Alkanols, Thereby Reducing The Acrylic Functionality Of The Oligomer 61.8 grams of 2-hydroxyethyl acrylate are premixed with 40.2 grams of HARCHEMEX*, a 2/1 blend of n-tetradecanol and n-hexadecanol, and labeled "Acrylation Agent II."

HARCHEMEX® is a registered trademark of the Harchem Division of Union Camp, Jacksonville, Fla. 32205.

Using the procedure of Example I, 49.3 grams (0.68 equivalents) of 2-ethyl-1,3-hexanediol were added to 150 grams (1.35 equivalents) of isophorone diisocyanate in the presence of about 0.04 grams of dibutyltin dilaurate to form the polyurethane precursor.

102.0 grams of "Acrylation Agent II" were added to the polyurethane precursor to form the acrylate-terminated polyurethane oligomer.

129.1 grams of lauryl acrylate and 8.6 grams of 2-hydroxycyclohexylphenone were added to the oligomer, which was then mixed to produce a clear, viscous optical coating composition.

EXAMPLE VIII

Preparation Of An Optical Coating Composition Employing An Oligomer Prepared From 2-Ethyl-1,3-Hexanediol And A Diol Derivative Of Cis-12-Hydroxyoctadec-9-Enoic Acid, Trimethylhexamethylene Diisocyanate, And 2-Hydroxyethyl Acrylate 52.1 grams of 2-ethylhexylacrylate (employed as a reactive diluent) were mixed with 150 grams (1.43 equivalents) of trimethylene diisocyanate, and labeled "low viscosity diisocyanate I."

Using the procedure of Example I, 46.9 grams (0.63 equivalents) of 2-ethyl-1,3-hexanediol and 15.4 grams (0.07 equivalents) of POLYCIN® 53 (a diol derivative of cis-12- hydroxyoctadec-9-enoic acid) were added to 202.1 grams of low viscosity diisocyanate I in the presence of about 0.04 grams of dibutyltin dilaurate to form the polyurethane precursor.

82.9 grams (0.72 equivalents) of 2-hydroxyethyl acrylate were added to the polyurethane precursor to form the acrylate-terminated polyurethane oligomer.

6.9 grams of 2-hydroxycyclohexylphenone were added to the oligomer to form the optical coating composition, which was labeled VIII.

EXAMPLE IX

Preparation of An Optical Coating Composition Employing 2-Ethyl-1,3-Hexanediol Premixed With A Reactive Diluent, Trimethylhexamethylene Diisocyanate, And 2-Hydroxyethyl Acrylate 114 grams of 2-ethylhexylacrylate (employed as a reactive diluent) were mixed with 150 grams (1.43 equivalents) of trimethylhexamethylene diisocyanate, and labelled "low viscosity diisocyanate II."

Using the procedure of Example I, 52.1 grams (0.714 equivalents) of 2-ethyl-1,3-hexanediol were added to 264 grams of low viscosity diisocyanate II in the presence of about 0.04 grams of dibutyltin dilaurate to form the polyurethane precursor.

82.9 grams (0.714 equivalents) of 2-hydroxyethyl acrylate were added to the polyurethane precursor to form the acrylate-terminated polyurethane oligomer.

8.0 grams of 2-hydroxycyclohexylphenone were added to the oligomer to form the optical coating composition, which was labelled IX.

EXAMPLE X

Portions of the uncured optical coating compositions of Examples I, VIII and IX were evaluated for various physico-chemical properties. Results of these tests are listed in TABLE I below:

TABLE I

| Test | I | VIII | IX |
|---|---|---|---|
| Viscosity @ 25° C. | 400–600 cps | 6,000–7,000 cps | 900–1,000 cps |
| Refractive Index | 1.467–1.469 | 1.477–1.479 | 1.471–1.473 |
| Specific Gravity | 0.973 | 1.03–1.05 | 1.029 |
| Unsaturation | 0.30 | 0.28 | 0.31 |
| Isocyanate content | 0.2 | 0.2 | 0.2 |
| Base No. | 10.0 | 10.0 | 10.0 |
| Acid No. | 0.7 | 1.4 | 1.0 |

Portions of the optical coating compositions of Examples I, VIII and IX were cast as films and cured by exposure to ultraviolet radiation. These films were then evaluated for tensile strength and elongation. Results of these tests are listed in TABLE II below:

TABLE II

| Property | I | VIII | IX |
|---|---|---|---|
| Tensile Strength | 500–700 psi | 2400–2600 psi | 1400–1600 psi |
| Elongation | 15–25% | 55–65% | 15–20% |
| Tear Strength | 60–65 lb/in | 150–200 lb/in | 160–165 lb/in |

"Mar Resistance" is a measure of the surface hardness and surface lubricity ("slip") of the cured optical coating. A cured optical coating passes this test if a fingernail drawn across its surface does not leave any scratches.

"Flexibility" is determined by manually bending a sheet of cured optical coating in half (180°) and observing whether any cracks appear in the cured optical coating. A "Good" rating means no cracks appeared. An "Acceptable" rating means no cracks appeared, but the optical coating was harder to bend than optical coatings which were rated "good".

The "Sun Light" exposure test consists of exposing a cured optical coating to sun light for a minimum of four hours.

The "Sun Lamp" exposure test consists of exposing a cured optical coating to a 275 watt Sylvania sun lamp for a minimum of twelve hours at a distance of one foot.

The "Fluorescent Lamp" exposure test consists of exposing a cured optical coating to fluorescent light for a minimum of twelve hours at a distance of one foot.

The "Incandescent Lamp" exposure test consists of exposing the surface of a cured optical coating to a 100 watt incandescent lamp for a minimum of twelve hours at a distance of one foot.

The "140° F. Oven" exposure test consists of placing the samples in an oven maintained at 140° F. for a minimum of eighteen hours.

EXAMPLE XI

The compositions of Examples I through IX were deposited as films upon clear plastic supports (approximately six inches square), and cured by exposure to ultraviolet radiation. The cured optical coatings so prepared were immersed in a photographic "developer" solution for approximately four minutes, immersed in a "fixer" solution for 1.5 minutes, immersed in a water rinse for approximately three minutes, and dried.

Some of the samples were then tested for mar resistance and flexibility while others were subjected to various exposure tests to determine resistance of the cured optical coatings to yellowing. Results of these tests are set out in TABLE III below:

TABLE III

| Optical Coating | Processing Rinse | Physical Testing | | Accelerated Aging | | | | |
|---|---|---|---|---|---|---|---|---|
| | | Mar Resistance | Flexibility | 140° F. Oven | Sun light | Sun lamp | Fluorescent lamp | Incandescent lamp |
| I | water rinse | acceptable | good | none | none | very light yellow | none | none |
| II | water rinse | acceptable | good | none | none | very light yellow | none | none |
| III | water rinse | good | acceptable | none | none | very light yellow | none | none |
| IV | | | | | | | | |
| (A) | water rinse | acceptable | good | none | none | very light yellow | none | none |
| (B) | water rinse | acceptable | good | none | none | very light yellow | none | none |
| V | | | | | | | | |
| (A) | water rinse | acceptable | good | none | none | very light yellow | none | none |
| (B) | water rinse | acceptable | good | none | none | very light yellow | none | none |
| VI | water rinse | acceptable | acceptable | none | none | very light yellow | none | none |
| VII | water rinse | good | acceptable | none | none | very light yellow | none | none |
| VIII | water rinse | good | acceptable | none | none | very light yellow | none | none |
| IX | water rinse | good | acceptable | none | none | very light yellow | none | none |

EXAMPLE XII

Comparison of Aqueous Alkanol Rinse With Water Rinse

Eight portions of the composition of Example VIII were deposited as films upon the surface of several clear plastic supports and cured by exposure to ultraviolet radiation. The eight cured optical coatings so prepared were immersed for 3.5 minutes in a photographic "developer" solution followed by 1.5 minutes immersion in a "fixer" solution. Four of the cured optical coatings were then immersed for 3 minutes in a 25% isopropanol aqueous solution and dried. The other four cured optical coatings were immersed in a conventional water rinse for 3 minutes and dried.

Once dry, the eight cured optical coatings were subjected to various exposure tests to determine what effect changing the water rinse to an aqueous alkanol rinse had upon yellowing. Results of these tests are set out in TABLE IV below:

TABLE IV

| Coating | Rinse | Sun lamp | Sun light | Fluorescent lamp | Incandescent lamp |
|---|---|---|---|---|---|
| VIII | water | None | very light yellow | None | None |
| VIII | 25% isopropanol | None | None | None | None |

We claim:

1. Unexposed photographic color print material comprising a laminate of a photoemulsion layer having front and back sides and an optically clear coating layer having front and back sides, wherein:
   A. said photoemulsion layer is adapted to be exposed to the image of a color print negative projected through said coating layer, developed by an immersion devleopment process, and viewed through said coating layer following said development process;
   B. the front side of said coating layer is the front outside surface of said color print material, and is adapted to be in contact with immersion development process chemicals during development of said print material;
   C. the back side of said coating layer faces the front side of said photoemulsion layer;
   D. said coating layer has the property of being essentially non-yellowing during and after immersion of said color print material in immersion development process chemicals with said coating layer in direct contact with said chemicals; and
   E. said coating layer consists essentially of the cured reaction product of:
      (i) from 45 to 90 weight percent, based upon total composition weight, of an oilgomer of th ®formula:

XOCNHR²NHCOR¹OCNHR²NHCO$\xleftarrow{}$R¹OCNHR²NHCO$\xrightarrow{}_n$Q
∥ ∥ ∥ ∥ ∥ ∥
O O O O O O wherein
R¹ and R² are independently selected from linear, branched, or cyclic saturated alkylene radicals including from six to twenty carbon atoms,
n is a whole number from zero to three,
Q and X are independently selected from:
(a) radicals of the formula

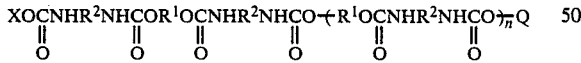

wherein R³, R⁴, and R⁵ are independently selected from hydrogen, methyl, ethyl, or propyl, m is an integer of from 1 to 10, and p is zero or one, and
(b) a saturated alkyl radical of from nine to twenty carbon atoms,
with the proviso that said oligomer must possess at least one acrylate or methacrylate group;
(ii) from 9 to 50 weight percent, based upon total composition weight, of a reactive diluent selected from the group consisting of lauryl acrylate, lauryl methacrylate, stearyl acrylate, stearyl methacrylate, ethylhexylacrylate, isodecyl acrylate, and mixtures thereof; and
(iii) from 0.5 to 5 weight percent, based upon the total composition weight, of a photoinitiator selected from the group consisting of 2-hydroxycyclohexylphenone, 2-hydroxy-2-methyl-1-phenyl-propan-1-one, and diethoxyacetophenone.

2. The material of claim 1 wherein n is zero.
3. The material of claim 1 wherein R¹ is:

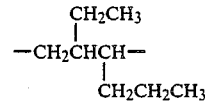

and R² is

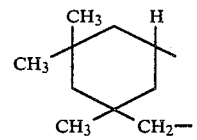

4. The material of claim 2, wherein R¹ is:

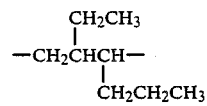

and R² is trimethyl hexamethylene.
5. The material of claim 1, wherein X and Q are each:

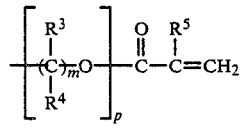

R³ is hydrogen;
R⁴ is methyl;
m and p are each one; and
R⁵ is hydrogen.
6. The composition of claim 1, wherein n is one.
7. The composition of claim 6, wherein R¹ is:

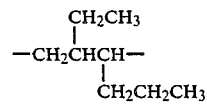

and R² is:

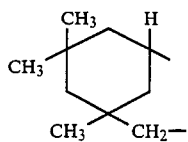

8. The composition of claim 6, wherein R¹ is:

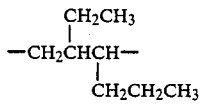

and R² is trimethyl hexamethylene.

9. The material of claim 1, wherein n is 2.

10. The material of claim 9, wherein R¹ is:

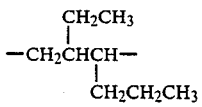

and R² is:

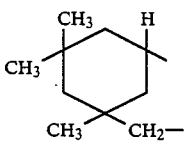

11. The material of claim 9, wherein R¹ is:

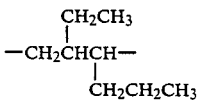

and R² is trimethyl hexamethylene.

12. The material of claim 1, wherein X is a saturated alkyl radical of from 9 to 20 carbon atoms, Q is:

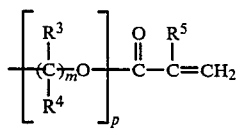

R³ is methyl;
R⁴ is hydrogen;
m and p are each one;
and R⁵ is selected from hydrogen and methyl.

13. The material of claim 12, wherein X is selected from decyl, tetradecyl, and hexadecyl.

14. The material of claim 1, wherein R¹ is selected from:

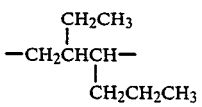

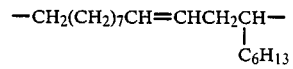

and mixtures thereof.

15. The material of claim 1, wherein R¹ is a branched alkylene moiety.

16. The material of claim 15, wherein R¹ is:

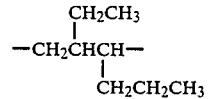

17. The material of claim 15, wherein R¹ is trimethyl hexamethylene.

18. The material of claim 1, further comprising a clear plastic support layer having a front side adjacent to the back side of said coating layer to support said coating layer and a back side adjacent to the front side of said photoemulsion.

19. The material of claim 1, further comprising a fluid-permeable backing material layer having a front side adjacent the back side of said photoemulsion layer and a back side forming the back outside surface of said color print material, wherein said backing material layer is adapted to be in contact with and to pass immersion development process chemicals during development of said print material, whereby immersion development process chemicals can be passed through said permeable backing material layer to develop said photoemulsion layer.

20. The material of claim 1, comprising the following layers in sequence:
A. said optically clear coating layer;
B. a clear plastic support layer for supporting said coating layer;
C. said photoemulsion layer; and
D. a fluid-permeable backing material layer.

21. The material of claim 1, wherein said coating layer is lenticulated.

22. A method of developing the photographic color print material defined in claim 1 following exposure thereof to form a latent image, comprising the steps of:
(i) immersing the photographic color print material in a developer solution for a time sufficient to develop the photoemulsion layer of said material;
(ii) immersing said material in a fixer solution for a time sufficient to halt further development of said photoemulsion layer;
(iii) immersing said material in an aqueous alkanol rinse for a time sufficient to remove substantially all of the developer and fixer solutions from said material; and
(iv) drying said material.

23. The process of claim 22 wherein said aqueous alkanol rinse is prepared from water and a solute selected from the group comprising methanol, ethanol, n-propanol, isopropanol, n-butanol, tert-butanol, isobutanol, sec-butanol, n-pentanol, isopentanol, tert-pentanol, and mixtures thereof.

24. The process of claim 22 wherein said aqueous alkanol rinse comprises from 20 to 30 percent isopropanol by weight maintained at from 80° to 100° F.

* * * * *